(12) United States Patent
Eguchi

(10) Patent No.: US 9,799,612 B2
(45) Date of Patent: Oct. 24, 2017

(54) SEMICONDUCTOR DEVICE AND MANUFACTURING METHOD OF THE SAME

(71) Applicant: DENSO CORPORATION, Kariya, Aichi-pref. (JP)

(72) Inventor: Kouji Eguchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/325,745

(22) PCT Filed: Jul. 14, 2015

(86) PCT No.: PCT/JP2015/003564
§ 371 (c)(1),
(2) Date: Jan. 12, 2017

(87) PCT Pub. No.: WO2016/009645
PCT Pub. Date: Jan. 21, 2016

(65) Prior Publication Data
US 2017/0170112 A1 Jun. 15, 2017

(30) Foreign Application Priority Data

Jul. 18, 2014 (JP) .................................. 2014-147970
Jun. 25, 2015 (JP) .................................. 2015-127992

(51) Int. Cl.
*H01L 23/00* (2006.01)
*H01L 23/528* (2006.01)
(Continued)

(52) U.S. Cl.
CPC ...... *H01L 23/562* (2013.01); *H01L 21/32135* (2013.01); *H01L 21/561* (2013.01);
(Continued)

(58) Field of Classification Search
CPC ... H01L 23/48; H01L 23/481; H01L 23/4825; H01L 23/52; H01L 23/5226;
(Continued)

(56) References Cited

U.S. PATENT DOCUMENTS 5,776,826 A  7/1998 Mitwalsky et al.
7,586,176 B2  9/2009 Wang et al.
(Continued)

*Primary Examiner* — Eduardo A Rodela
(74) *Attorney, Agent, or Firm* — Posz Law Group, PLC

(57) ABSTRACT

A semiconductor device includes a substrate, a laminated wiring layer unit, a nitride film disposed on the laminated wiring layer unit, a semiconductor element portion, a sealing portion surrounding the element portion. In the sealing portion, multiple wiring layers are connected with a sealing layer to configure a sealing structure which surrounds the element portion. The laminated wiring layer unit includes an uppermost layer which is made of material having higher adhesion to an uppermost wiring layer, and a protection insulating film made of material having higher adhesion to the sealing layer than the nitride film is disposed on the nitride film. In the sealing portion, a via-hole is defined in the protection insulating film, the nitride film, and the uppermost insulating film to partially expose the uppermost wiring layer. The sealing layer is embedded into the via-hole and is also disposed on a protection insulating film around the via-hole.

11 Claims, 12 Drawing Sheets

(51) Int. Cl.
*H01L 23/532* (2006.01)
*H01L 23/31* (2006.01)
*H01L 23/522* (2006.01)
*H01L 21/768* (2006.01)
*H01L 21/56* (2006.01)
*H01L 21/78* (2006.01)
*H01L 21/3213* (2006.01)
*H01L 23/48* (2006.01)

(52) U.S. Cl.
CPC .. *H01L 21/76802* (2013.01); *H01L 21/76877* (2013.01); *H01L 21/76892* (2013.01); *H01L 21/78* (2013.01); *H01L 23/3192* (2013.01); *H01L 23/481* (2013.01); *H01L 23/528* (2013.01); *H01L 23/5226* (2013.01); *H01L 23/5283* (2013.01); *H01L 23/53295* (2013.01); *H01L 23/564* (2013.01)

(58) Field of Classification Search
CPC . H01L 23/528; H01L 23/5283; H01L 23/562; H01L 23/564; H01L 21/28; H01L 21/311; H01L 21/77; H01L 21/78
See application file for complete search history.

(56) References Cited

U.S. PATENT DOCUMENTS

| | | | |
|---|---|---|---|
| 8,618,618 B2 | 12/2013 | Tsutsue et al. | |
| 2003/0032230 A1* | 2/2003 | Nagano | H01L 21/76832 438/200 |
| 2004/0089953 A1* | 5/2004 | McCormick | H01L 21/76877 257/775 |
| 2005/0098893 A1 | 5/2005 | Tsutsue et al. | |
| 2005/0280120 A1 | 12/2005 | Tomita | |
| 2006/0012012 A1 | 1/2006 | Wang et al. | |
| 2007/0194409 A1 | 8/2007 | Wang et al. | |
| 2008/0258266 A1* | 10/2008 | Takemura | H01L 23/562 257/620 |
| 2008/0315366 A1 | 12/2008 | Tomita | |
| 2009/0065903 A1 | 3/2009 | Tsutsue et al. | |
| 2009/0121313 A1 | 5/2009 | Hashimoto | |
| 2009/0267193 A1* | 10/2009 | Hayasaki | H01L 23/562 257/620 |
| 2009/0289325 A1 | 11/2009 | Wang et al. | |
| 2009/0321890 A1* | 12/2009 | Jeng | H01L 21/78 257/620 |
| 2010/0308464 A1 | 12/2010 | Tsutsue et al. | |
| 2011/0254136 A1 | 10/2011 | Tsutsue et al. | |
| 2011/0278722 A1* | 11/2011 | Miki | H01L 21/6836 257/737 |
| 2012/0181670 A1 | 7/2012 | Takemura et al. | |
| 2012/0261835 A1 | 10/2012 | Tomita | |
| 2012/0280401 A1 | 11/2012 | Tsutsue et al. | |
| 2013/0015587 A1 | 1/2013 | Okutsu et al. | |
| 2013/0299948 A1 | 11/2013 | Tsutsue et al. | |
| 2014/0054749 A1 | 2/2014 | Tomita | |
| 2014/0097861 A1 | 4/2014 | Okutsu et al. | |
| 2014/0210056 A1 | 7/2014 | Tsutsue et al. | |
| 2014/0239455 A1* | 8/2014 | Ishii | H01L 23/564 257/620 |
| 2015/0084164 A1 | 3/2015 | Tomita | |
| 2015/0194391 A1 | 7/2015 | Tsutsue et al. | |
| 2015/0348917 A1* | 12/2015 | Tsai | H01L 21/76898 257/774 |
| 2017/0182732 A1* | 6/2017 | Toronjo | B32B 3/266 |

* cited by examiner

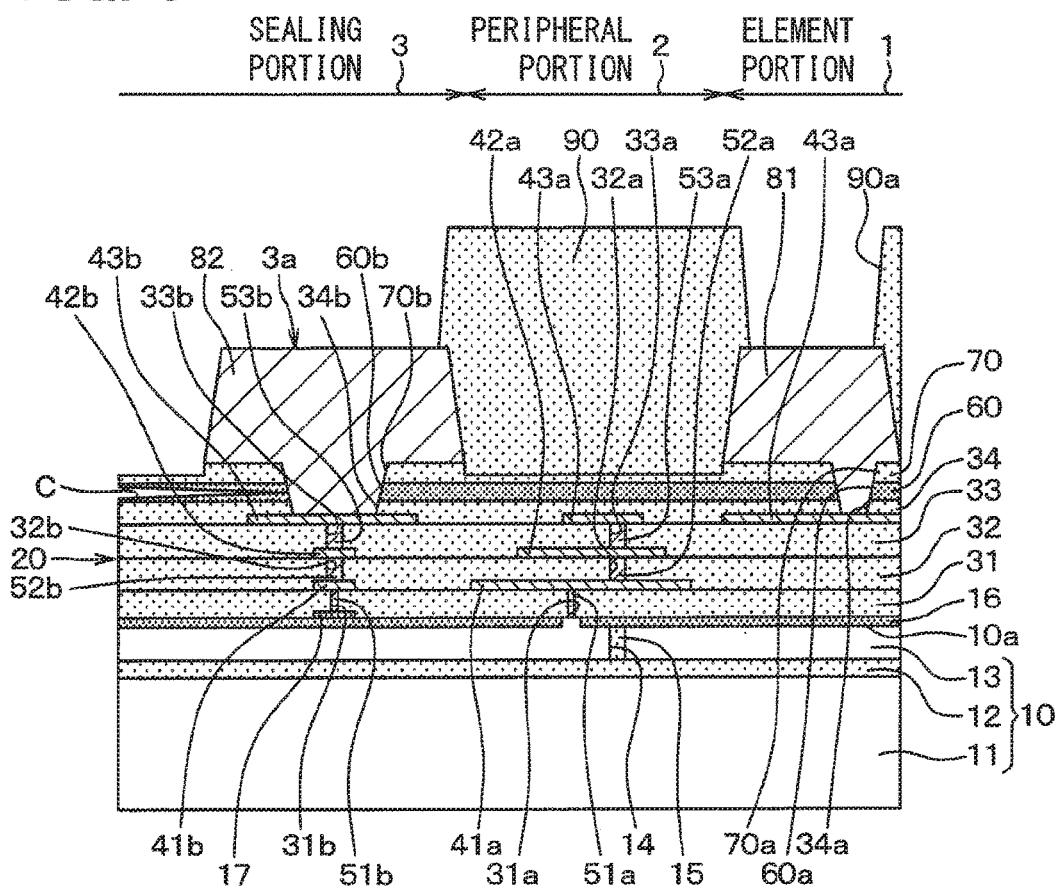
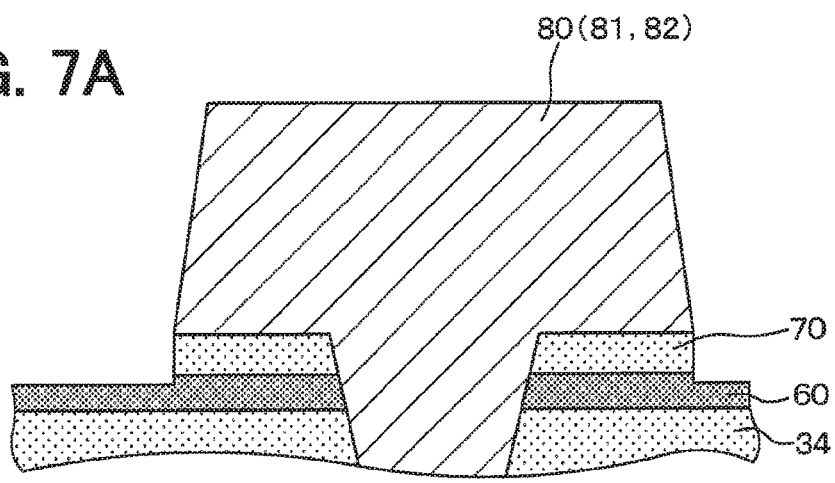

SEMICONDUCTOR DEVICE AND MANUFACTURING METHOD OF THE SAME

CROSS REFERENCE TO RELATED APPLICATIONS

This application is a U.S. national stage of International Patent Application No. PCT/JP2015/003564 filed on Jul. 14, 2015 and is based on Japanese Patent Application No. 2014-147970 filed on Jul. 18, 2014 and 2015-127992 filed on Jun. 25, 2015, the disclosures of which are incorporated herein by references.

TECHNICAL FIELD

The present disclosure relates to a semiconductor device provided with a sealing structure in a sealing portion surrounding an element portion and a manufacturing method of the semiconductor device.

BACKGROUND ART

A semiconductor device proposed in the related art (for example, see Patent Literature 1) has an element portion and a sealing portion surrounding the element portion, and a sealing structure surrounding the element portion is formed in the sealing portion. More specifically, the semiconductor device has a substrate, and a laminated wiring layer unit formed by alternately laminating interlayer insulating films and wiring layers is disposed on the substrate. In the sealing portion, the wiring layers in the respective layers are formed in frame shape and connected to one another so as to surround the element portion.

A nitride film having lower permeability to moisture (water drops and water vapor) than the interlayer insulating film is provided on the laminated wiring layer unit. That is to say, the nitride film restricting moisture from coming inside the laminated wiring layer unit from outside is provided on the laminated wiring layer unit. The nitride film is provided with a via-hole, through which an uppermost wiring layer located at a top of the laminated wiring layer unit and nearest to the nitride film is exposed, and a sealing layer is provided in the via-hole.

The via-hole is formed in a frame shape along the uppermost wiring layer and the sealing layer is therefore also formed in a frame shape. Hence, the wiring layers and the sealing layer in the laminated wiring layer unit together form the sealing structure surrounding the element portion.

The semiconductor device as above is manufactured as follows. That is, a semiconductor wafer is prepared first. The semiconductor wafer includes multiple chip regions each having the element portion and the sealing portion and the respective chip regions are defined by scribe portions. The laminated wiring layer unit is provided on the semiconductor wafer and the nitride film is provided on the laminated wiring layer unit. Subsequently, the sealing structure to surround the element portion is formed by providing the via-hole to the nitride film and providing the sealing layer. The semiconductor device is manufactured by dicing the semiconductor wafer into individual chips along the scribe portions using a dicing cutter or the like.

According to the manufacturing method as above, although cracking (chipping) may occur in an outer edge of a chip (semiconductor device) in some cases when the semiconductor wafer is diced into individual chips, the sealing structure restricts the cracking from extending. Hence, propagation of the cracking to the element portion can be restricted.

In the semiconductor device manufactured as above, however, the nitride film having low adhesion to metal (sealing layer) is exposed and the nitride film readily peels. Hence, in the semiconductor device manufactured as above, the nitride film may possibly peel and become a foreign substance during transportation of the semiconductor device or during use of the semiconductor device. In particular, in a case where cracking occurs in the nitride film when the semiconductor wafer is diced, the nitride film peels more readily due to the cracking.

PRIOR ART LITERATURE

Patent Literature

[Patent Literature 1] JP 2009-123734 A

SUMMARY OF INVENTION

In view of the foregoing difficulties, it is an object of the present disclosure to provide a semiconductor device capable of restricting peeling of a nitride film and a manufacturing method of the semiconductor device.

According to a first aspect of the present disclosure, a semiconductor device includes a substrate, a laminated wiring layer unit, a nitride film, an element portion, and a sealing portion. The substrate has one surface. The laminated wiring layer unit is disposed on the one surface of the substrate. The laminated wiring layer unit includes multiple interlayer insulating films and multiple wiring layers made of metal. The multiple interlayer insulating films and the multiple wiring layers are laminated alternately. The nitride film is disposed on the laminated wiring layer unit and has a lower permeability to moisture than the interlayer insulating film. A semiconductor element is disposed in the element portion. The sealing portion is disposed so as to surround the element portion when viewed in a direction normal to the one surface of the substrate. In the sealing portion, a sealing layer made of metal is disposed and the sealing layer is connected with an uppermost wiring layer located nearest to the nitride film among the plurality of wiring layers. The sealing layer and the multiple wiring layers connected with the sealing layer configure a sealing structure that surrounds the element portion.

The laminated wiring layer unit includes an uppermost insulating film as an uppermost layer on a side opposite to the substrate, and the uppermost insulating film is made of a material having a higher adhesion to the uppermost wiring layer than the nitride film. A protection insulating film is disposed on the nitride film and the protection insulating film is made of a material having a higher adhesion to the sealing layer than the nitride film. In the sealing portion, a via-hole is defined in the protection insulating film, the nitride film, and the uppermost insulating film so that a part of the uppermost wiring layer is exposed. The sealing layer is embedded into the via-hole and is also disposed on the protection insulating film at a portion located on a periphery of the via-hole. The protection insulating film, the nitride film, and the uppermost insulating film are partially sandwiched between the sealing layer and the uppermost wiring layer on an outer side of the sealing structure.

According to the semiconductor device configured as above, the nitride film is sandwiched between the protection insulating film and the uppermost insulating film both having higher adhesion to metal than the nitride film. Further, the protection insulating film, the nitride film, and the uppermost insulating film are partially sandwiched between the sealing layer and the uppermost wiring layer on the outer side of the sealing structure. Hence, even when cracking occurs in the nitride film, peeling of the nitride film can be restricted during transportation of the semiconductor device or during use of the semiconductor device.

According to a second aspect of the present disclosure, a manufacturing method of the semiconductor device according to the first aspect of the present disclosure includes: preparing a wafer including a plurality of chip regions each having the element portion and the sealing portion, the plurality of chip regions being defined by respective scribe portions and each of the plurality of chip regions providing the substrate when the plurality of chip regions are divided along the respective scribe portions; disposing the laminated wiring layer unit on the one surface of the wafer; disposing the nitride film on the laminated wiring layer unit; disposing the protection insulating film on the nitride film; disposing the via-hole in the sealing portion to penetrate the protection insulating film, the nitride film, and the uppermost insulating film so that a part of the uppermost wiring layer is exposed; depositing a metal film on the protection insulating film while filling up the via-hole; forming the sealing layer by patterning the metal film; forming the sealing structure including the plurality of wiring layers and the sealing layer in such a manner that the protection insulating film, the nitride film, and the uppermost insulating film are partially sandwiched between the sealing layer and the uppermost wiring layer on an outer side of the sealing structure; and dicing the wafer into individual chips along the respective scribe portions.

According to the manufacturing method as above, even though the cracking is introduced from the scribe portion to the sealing portion when the wafer is diced into individual chips, the cracking can be restricted from extending to the element portion by the sealing structure. In addition, the protection insulating film, the nitride film, and the uppermost insulating film are partially sandwiched between the sealing layer and the uppermost wiring layer on the outer side of the sealing structure. Hence, it is possible to manufacture the semiconductor device in which even when cracking occurs in the nitride film, peeling of the nitride film can be restricted during transportation of the semiconductor device or during use of the semiconductor device.

BRIEF DESCRIPTION OF DRAWINGS

The above and other objects, features and advantages of the present invention will become more apparent from the following detailed description made with reference to the accompanying drawings. In the drawings:

FIG. 6 is a sectional view showing a state when cracking occurs in the process of FIG. 5B;

FIG. 7A is a sectional view when a metal film is patterned for a nitride film to be exposed from a protection insulating film;

EMBODIMENTS FOR CARRYING OUT INVENTION

Hereinafter, embodiments of the present disclosure will be described according to the drawings. In the respective embodiments below, a description will be given by labeling same or equivalent portions with same reference symbols.

First Embodiment

Figure 1:
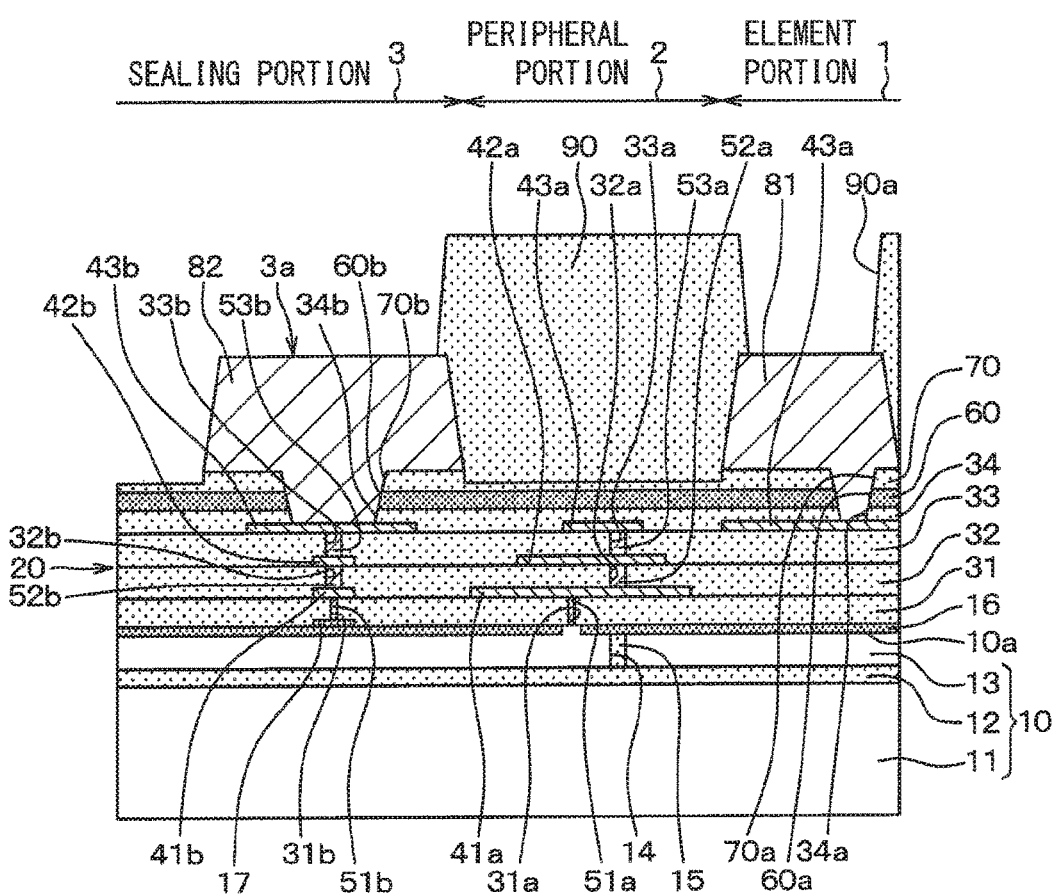
FIG. 1 is a sectional view of a semiconductor device according to a first embodiment of the present disclosure.
Figure 2:
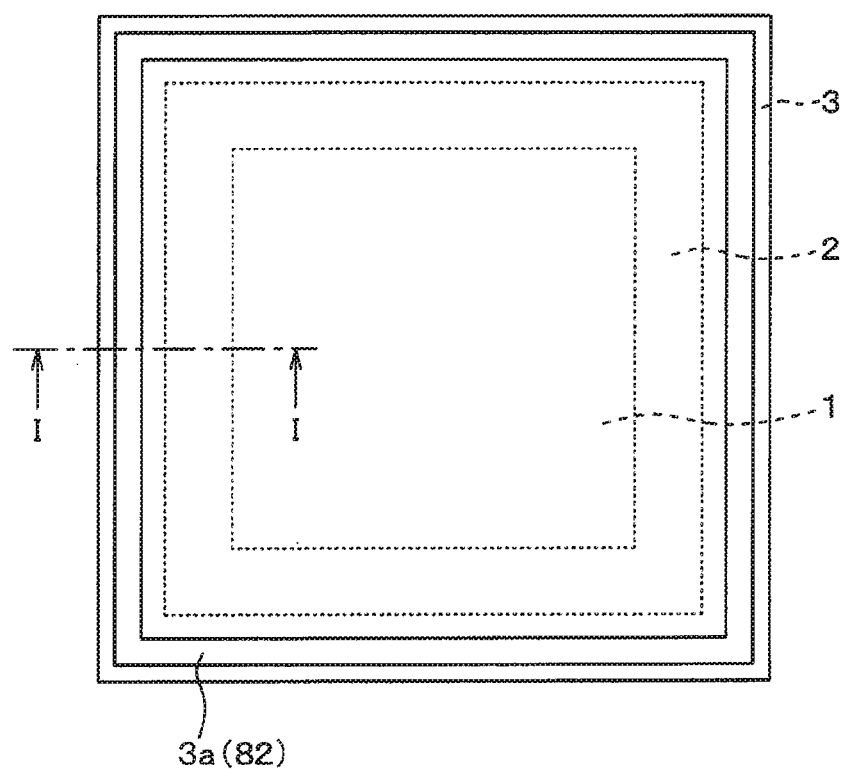
FIG. 2 is a schematic top view of the semiconductor device shown in FIG. 1.

A first embodiment of the present disclosure will be described with reference to the drawings. As are shown in FIG. 1 and FIG. 2, a semiconductor device includes an element portion 1, an outer peripheral portion 2 surrounding the element portion 1, and a sealing portion 3 surrounding the outer peripheral portion 2, and a laminated wiring layer unit 20 is disposed on one surface 10a of a substrate 10. FIG. 1 corresponds to a sectional view taken along the line I-I of FIG. 2. FIG. 2 is a schematic top view showing a locational relation among the element portion 1, the outer peripheral portion 2, the sealing portion 3, and a sealing structure 3a (sealing layer 82) described below.

The substrate 10 used in the present embodiment is an SOI substrate in which a supporting substrate 11, an insulating film 12, and a semiconductor layer 13 are sequentially laminated. Although a detailed structure is not shown in the drawings, the element portion 1 of the substrate 10 is provided with a semiconductor element, such as a transistor or a diode, by appropriately providing a P-type impurity layer and an N-type impurity layer to the semiconductor layer 13.

A known guard ring or the like is provided along the outer peripheral portion 2 of the substrate 10. In the present embodiment, the semiconductor layer 13 in the outer peripheral portion 2 is insulated and separated between an inner edge on a side of the element portion 1 and an outer edge on a side of the sealing portion 3 by providing a trench 14 between the inner edge and the outer edge and embedding an insulating film 15 into the trench 14. The guard ring or the like is provided along an outer edge of the outer peripheral potion 2.

The laminated wiring layer unit 20 includes first through fourth interlayer insulating films 31 through 34 and the first through fourth wiring layers 41a through 43a, 41b through 43b, 51a through 53a, and 51b through 53b, and the interlayer insulating films and the wiring layers are laminated alternately. The laminated wiring layer unit 20 is disposed on the one surface 10a of the substrate 10 via a separation layer (shallow trench isolation) 16. The separation layer 16 is provided so that a predetermined region of the semiconductor layer 13 to be exposed. In FIG. 1, a part of the semiconductor layer 13 in the outer peripheral portion 2 is exposed from the separation layer 16. It should be noted, however, that a part of the semiconductor layer 13 in the element portion 1 is also exposed from the separation layer 16 when viewed in a different cross section from the cross section of FIG. 1.

More specifically, the first interlayer insulating film 31 is provided on the separation film 16. On the first interlayer insulating film 31, a first connection wiring 41a is provided in the outer peripheral portion 2 and a first sealing wiring 41b is provided in the sealing portion 3. The first sealing wiring 41b is formed in a rectangular frame shape so as to surround the outer peripheral portion 2.

In the outer peripheral portion 2, a first connection via-hole (contact hole) 31a is provided to the first interlayer insulating film 31 so as to reach the semiconductor layer 13 exposed from the separation layer 16. A first connection via 51a is embedded into the first connection via-hole 31a. Consequently, the first connection wiring 41a and the not-shown guard ring are electrically connected via the first connection via 51a.

In the sealing portion 3, a stopper film 17 made of polysilicon or the like is provided on the separation layer 16. The stopper film 17 prevents the semiconductor layer 13 from being exposed by preventing the separation layer 16 from being removed during a forming process of a first sealing via-hole (contact hole) 31b described below. In the sealing portion 3, the first sealing via-hole 31b is provided to the first interlayer insulating film 31 so as to reach the stopper film 17. A first sealing via 51b to be connected to the first sealing wiring 41b is embedded into the first sealing via-hole 31b. As with the first sealing wiring 41b, the first sealing via 51b (first sealing via-hole 31b) is formed in a rectangular frame shape so as to surround the outer peripheral portion 2. In the present embodiment, the first connection wiring 41a and the first connection via 51a as well as the first sealing wiring 41b and the first sealing via 51b form the first wiring layer.

The second interlayer insulating film 32 is provided on the first interlayer insulating film 31. On the second interlayer insulating film 32, a second connection wiring 42a is provided in the outer peripheral portion 2 and a second sealing wiring 42b is provided in the sealing portion 3. The second sealing wiring 42b is formed in a rectangular frame shape so as to surround the outer peripheral portion 2 and disposed above the first sealing wiring 41b.

In the outer peripheral portion 2, a second connection via-hole 32a is provided to the second interlayer insulating film 32 and a second connection via 52a is embedded into the second connection via-hole 32a. Consequently, the second connection wiring 42a and the first connection wiring 41a are electrically connected via the second connection via 52a.

In the sealing portion 3, a second sealing via-hole 32b is provided to the second interlayer insulating film 32, and a second sealing via 52b to be connected to the second sealing wiring 42b is embedded into the second sealing via-hole 32b. As with the second sealing wiring 42b, the second sealing via 52b (second sealing via-hole 32b) is formed in a rectangular frame shape so as to surround the outer peripheral portion 2. In the present embodiment, the second connection wiring 42a and the second connection via 52a together with the second sealing wiring 42b and the second sealing via 52b form the second wiring layer.

Further, the third interlayer insulating film 33 is provided on the second interlayer insulating film 32. On the third interlayer insulating film 33, a third connection wiring 43a is provided in the element portion 1 and also in the outer peripheral portion 2 and a third sealing wiring 43b is provided in the sealing portion 3. The third sealing wiring 43b is formed in a rectangular frame shape so as to surround the outer peripheral portion 2 and disposed above the second sealing wiring 42b. In the present embodiment, the third sealing wiring 43b corresponds to an uppermost wiring layer of the present disclosure.

In the outer peripheral portion 2, a third connection via-hole 33a is provided to the third interlayer insulating film 33, and a third connection via 53a is embedded into the third connection via-hole 33a. Consequently, the third connection wiring 43a and the second connection wiring 42a are electrically connected via the third connection via 53a.

In the sealing portion 3, a third sealing via-hole 33b is provided to the third interlayer insulating film 33, and a third sealing via 53b to be connected to the third sealing wiring 43b is embedded into the third sealing via-hole 33b. As with the third sealing wiring 43b, the third sealing via 53b (third sealing via-hole 33b) is formed in a rectangular frame shape so as to surround the outer peripheral portion 2. In the present embodiment, the third connection wiring 43a and the third connection via 53a as well as the third sealing wiring 43b and the third sealing via 53b form the third wiring layer.

The fourth interlayer insulating film 34 is provided on the third interlayer insulating film 33. That is to say, the laminated wiring layer unit 20 includes the fourth interlayer insulating film 34 as an uppermost layer on an opposite side to the substrate 10. In the present embodiment, the fourth interlayer insulating film 34 corresponds to an uppermost insulating film of the present disclosure.

In the present embodiment, the first through fourth interlayer insulating films 31 through 34 are formed of an oxide film, such as TEOS (Tetra Ethyl Ortho Silicate) which have lower hardness (being softer) than a nitride film 60 to be described below and higher adhesion to metal than the nitride film 60. The first through fourth wiring layers 41a through 43a, 41b through 43b, 51a through 53a, and 51b through 53b are made of metal or alloy, such as Al, Cu, or AlCu. When viewed in a cross section different from the cross section of FIG. 1, the first connection wiring 41a, the first connection via 51a, the second connection wiring 42a, and the second connection via 52a are appropriately provided in the element portion 1 in the same manner as in the outer peripheral portion 2. The first through third wiring layers 41a through 43a and the first through third wiring layers 51a through 53a provided in the element portion 1 and the first through third wiring layers 41a through 43a and the first through third wiring layers 51a through 53a provided in the outer peripheral portion 2 are appropriately connected in a different cross section from the cross section shown in FIG. 1.

The nitride film 60 having lower permeability to moisture (water drops and water vapor) than the first through fourth interlayer insulating films 31 through 34 is disposed on the laminated wiring layer unit 20. A nitrogen-free protection insulating film 70 having lower hardness than the nitride film 60 and higher adhesion to metal than the nitride film 60 is disposed on the nitride film 60. In the present embodiment, the protection insulating film 70 is formed of an oxide film, such as TEOS, as with the first through fourth interlayer insulating films 31 through 34, and the protection insulating film 70 is disposed on the nitride film 60 across an entire surface on an opposite side to the fourth interlayer insulating film 34 with respect to the nitride film 60. That is to say, the protection insulating film 70 is disposed so as to cover an entire portion of the nitride film 60 on a side opposite to the fourth interlayer insulating film 34. In other words, the nitride film 60 is not exposed in the portion on the opposite side to the fourth interlayer insulating film 34.

In the element portion 1, connection via-holes 70a, 60a, and 34a are provided so as to penetrate, respectively, through the protection insulating film 70, the nitride film 60, and the fourth interlayer insulating film 34 so that the third connection wiring 43a is exposed. An electrode 81 is embedded into the connection via-holes 70a, 60a, and 34a. The electrode 81 is made of metal or alloy, such as Al, Cu, and AlCu, and connected to an outside circuit via a bonding wire or the like. In FIG. 1, only one electrode 81 (in one connection via-hole 70a, one via-hole 60a, and one via-hole 34a) is shown. It should be understood that multiple electrodes 81 (in multiple connection via-holes 70a, 60a, and 34a) are provided in actual use.

In the sealing portion 3, sealing via-holes 70b, 60b, and 34b are provided so as to penetrate, respectively, through the protection insulating film 70, the nitride film 60, and the fourth interlayer insulating film 34 so that the third sealing wiring 43b is exposed. More specifically, the sealing via-holes 70b, 60b, and 34b are provided in such a manner that the third sealing wiring 43b of a rectangular frame shape is exposed in a rectangular frame shape along substantially a center portion between an inner edge on the side of the outer peripheral portion 2 and an outer edge on the opposite side to the inner edge. In the present embodiment, the sealing via-holes 70b, 60b, and 34b correspond to a via-hole of the present disclosure.

A sealing layer 82 made of Al, Cu, AlCu, or the like is embedded into the sealing via-holes 70b, 60b, and 34b. Consequently, the sealing layer 82, the third sealing wiring 43b, the third sealing via 53b, the second sealing wiring 42b, the second sealing via 52b, the first sealing wiring 41b, and the first sealing via 51b together form the sealing structure 3a surrounding the element portion 1 and the outer peripheral portion 2. The sealing structure 3a is insulated from the semiconductor layer 13.

The sealing layer 82 is embedded into the sealing via-holes 70b, 60b, and 34b and also provided on the protection insulating film 70 in a portion located on a periphery of the sealing via-hole 70b. That is to say, the protection insulating film 70, the nitride film 60, and the fourth interlayer insulating film 34 located, respectively, on the periphery of the sealing via-holes 70b, 60b, and 34b are sandwiched between the sealing layer 82 and the third sealing wiring 43b.

A protection film 90 is disposed on the protection insulating film 70 and a bonding opening 90a is provided to the protection film 90. The electrode 81 to be connected to the outside circuit is exposed through the bonding opening 90a. In other words, the protection film 90 is disposed between the adjacent electrodes 81. Owing to the configuration as above, when the bonding wire or the like is connected to the electrode 81, the protection film 90 restricts an expansion of the electrode 81 in a planar direction on the one surface 10a of the substrate 10. Consequently, the adjacent electrodes 81 are restricted from being electrically connected by a physical contact.

The above has described the configuration of the semiconductor device of the present embodiment. The semiconductor device configured as above is used after the semiconductor device is sealed with a packaging material, such as mold resin. Hence, the protection film 90 is made of material having high adhesion to the packaging material such as polyimide or the like.

A manufacturing method for the semiconductor device as above will now be described with reference to FIG. 3A through FIG. 5B.

Figure 3A:
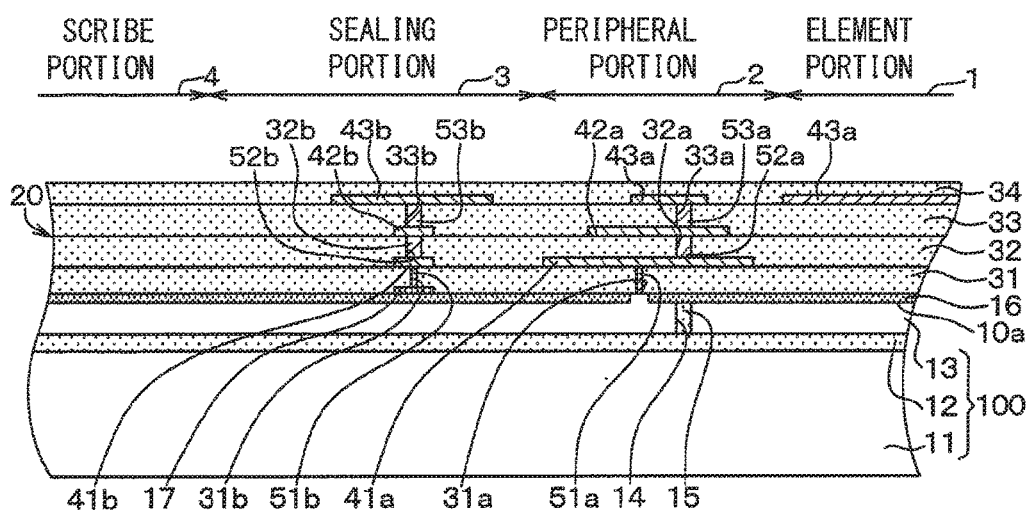
FIG. 3A is a sectional view showing a manufacturing process of the semiconductor device shown in FIG. 1.

Firstly, as is shown in FIG. 3A, a semiconductor wafer 100, in which the supporting substrate 11, the insulating film 12, and the semiconductor layer 13 are laminated sequentially, is prepared and the trench 14 and the insulating film 15 are formed on the semiconductor layer 13. Subsequently, the separation layer 16, the stopper film 17, and the laminated wiring layer unit 20 are appropriately provided to the semiconductor wafer 100.

The semiconductor wafer 100 includes multiple chip regions each having the element portion 1, the outer peripheral portion 2, and the sealing portion 3 and the respective chip regions are defined by scribe portions 4. In FIG. 3A, only one element portion 1, one outer peripheral portion 2, one sealing portion 3, and one scribe portion 4 are shown. When providing the first sealing via-hole 31b to the laminated wiring layer unit 20, removal of the separation layer 16 is restricted by using the stopper film 17 as an etching stopper.

Figure 3B:
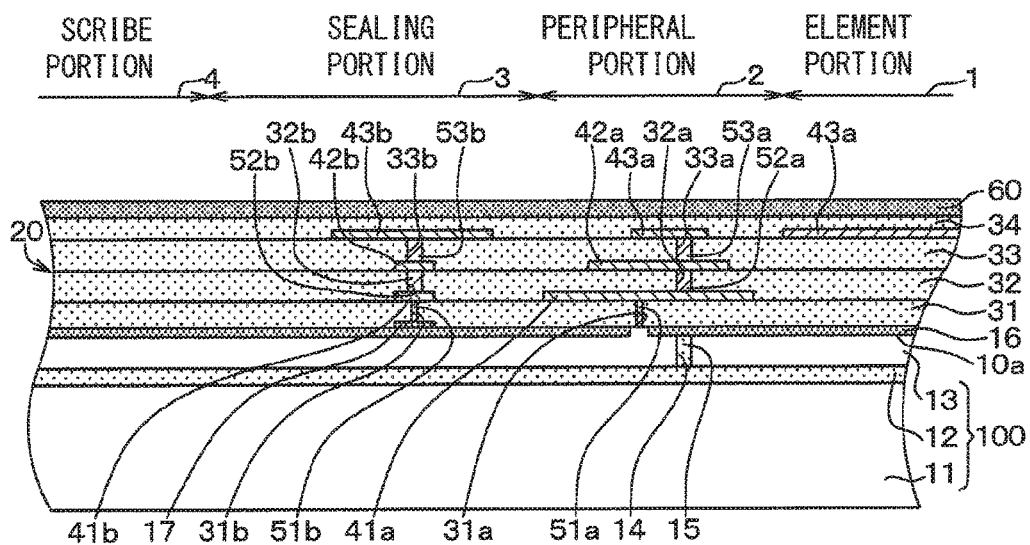
FIG. 3B is a sectional view showing the manufacturing process of the semiconductor device shown in FIG. 1.
Figure 3C:
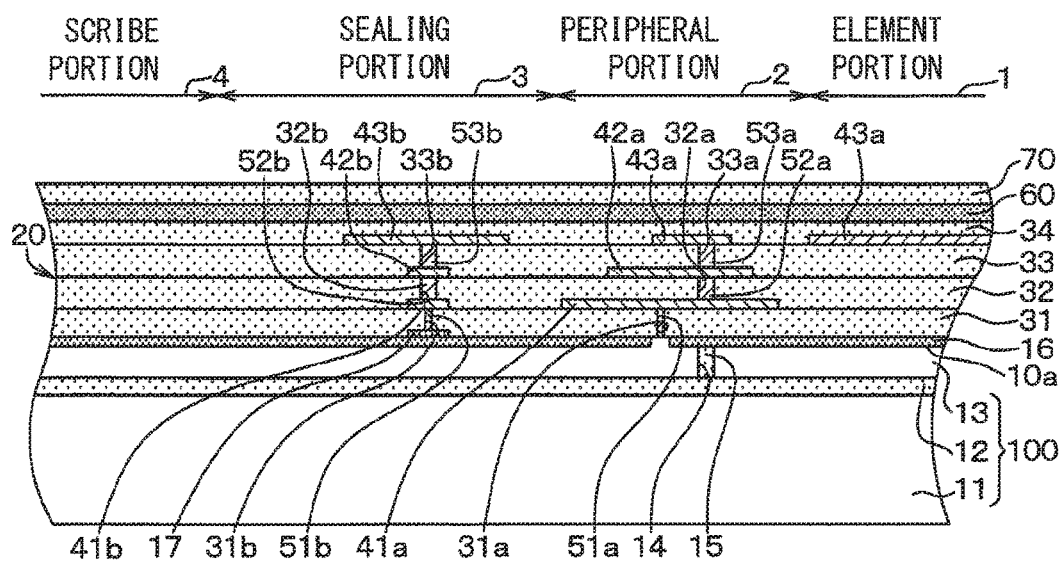
FIG. 3C is a sectional view showing the manufacturing process of the semiconductor device shown in FIG. 1.

Subsequently, as is shown in FIG. 3B, the nitride film 60 is deposited on the laminated wiring layer unit 20 by CVD (Chemical Vapor Deposition) or the like. Subsequently, as is shown in FIG. 3C, the protection insulating film 70 is deposited on the nitride film 60 by CVD or the like.

Figure 4A:
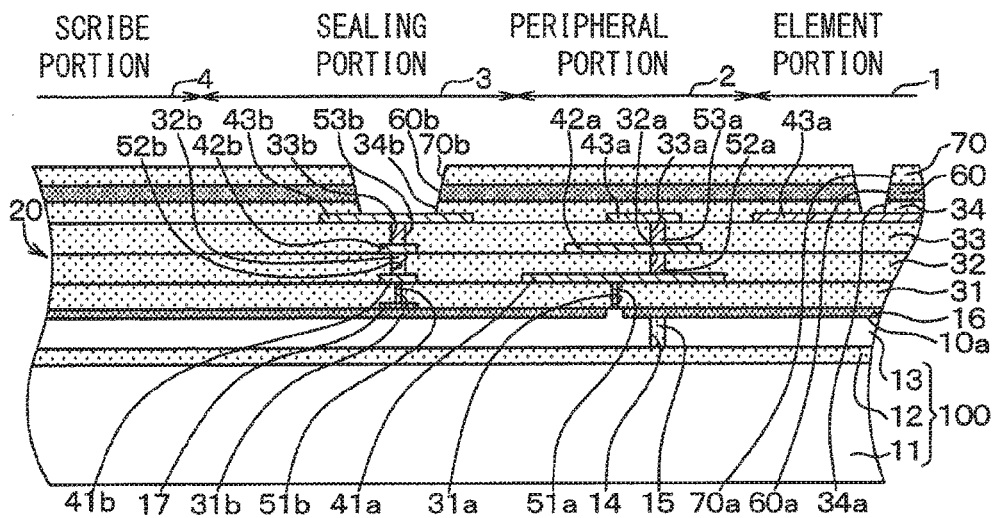
FIG. 4A is a sectional view showing the manufacturing process of the semiconductor device shown in FIG. 1.

Subsequently, as is shown in FIG. 4A, the connection via-holes 70a, 60a, and 34a are provided in the element portion 1 so as to penetrate, respectively, through the protection insulating film 70, the nitride film 60, and the fourth interlayer insulating film 34 so that the third connection wiring 43a is exposed. Likewise, the sealing via-holes 70b, 60b, and 34b are provided in the sealing portion 3 so as to penetrate, respectively, through the protection insulating film 70, the nitride film 60, and the fourth interlayer insulating film 34 so that the third sealing wiring 43b is exposed. As has been described above, the sealing via-holes 70b, 60b, and 34b are provided in such a manner that the third sealing wiring 43b of a rectangular frame shape is exposed in a rectangular frame shape along substantially a center portion between the inner edge on the side of the outer peripheral portion 2 and the outer edge on the opposite side to the inner edge.

Figure 4B:
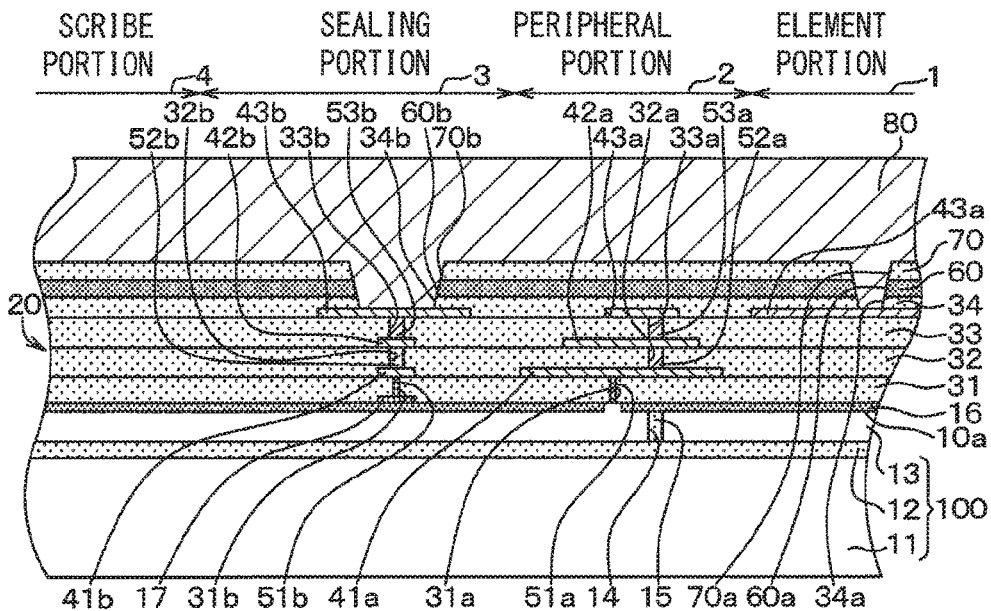
FIG. 4B is a sectional view showing the manufacturing process of the semiconductor device shown in FIG. 1.

Subsequently, as is shown in FIG. 4B, a metal film 80 made of Al, Cu, AlCu, or the like is deposited on the protection insulation film 70 by PVD (Physical Vapor Deposition) or the like so as to fill up the connection via-holes 70a, 60a, and 34a and the sealing via-holes 70b, 60b, and 34b.

Figure 4C:
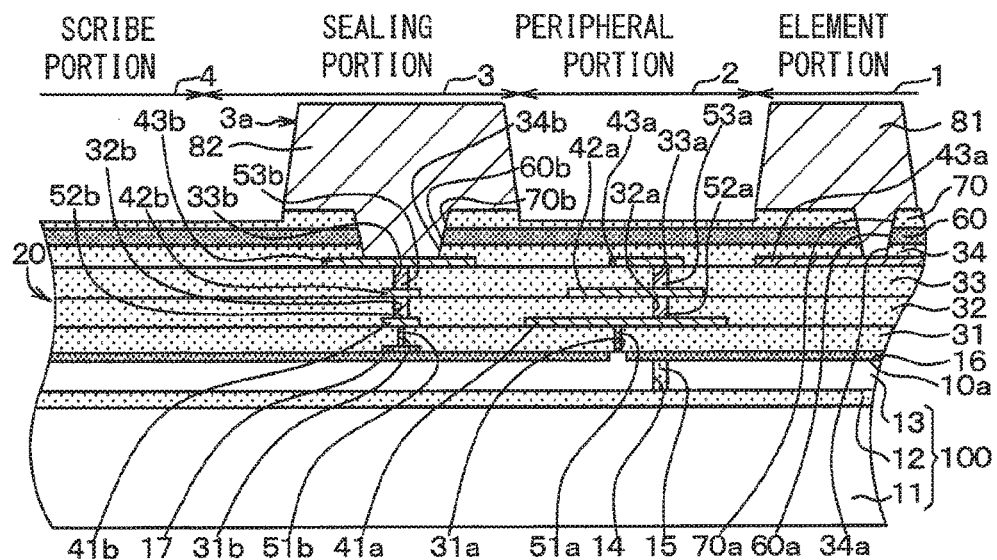
FIG. 4C is a sectional view showing the manufacturing process of the semiconductor device shown in FIG. 1.

Subsequently, as is shown in FIG. 4C, resist (not shown) is disposed on the metal film 80, and the electrode 81 and the sealing layer 82 are formed by patterning the metal film 80 by dry etching or the like using the resist as a mask. Herein, the sealing layer 82 is formed in a rectangular frame shape and also provided on the protection insulating film 70 in a portion on the periphery of the sealing via-hole 70*b*. Consequently, the protection insulating film 70, the nitride film 60, and the fourth interlayer insulating film 34 located, respectively, on the periphery of the sealing via-holes 70*b*, 60*b*, and 34*b* are sandwiched between the sealing layer 82 and the third sealing wiring 43*b*. The resist and an etching product adhering onto the electrode 81 and the sealing layer 82 are removed later by, for example, wet washing using an organic liquid solution.

The etching product referred to herein includes a reaction product removed (generated) by dry etching and an accumulated film (deposited film) generated when the metal film 80 is dry-etched to protect a side surface of the metal film 80 during normal dry etching. In the present embodiment, because the protection insulating film 70 is used as an etching stopper, the protection insulating film 70 is also slightly removed where the metal film 80 is removed. In the present embodiment, it should be noted that while the protection insulating film 70 is used as an etching stopper, the metal film 80 is patterned in such a manner that the nitride film 60 is not exposed in a portion on the opposite side to the fourth interlayer insulating film 34. In short, the protection insulating film 70 provided in the process of FIG. 3C is thicker than a portion removed in the process of FIG. 4C.

Figure 5A:
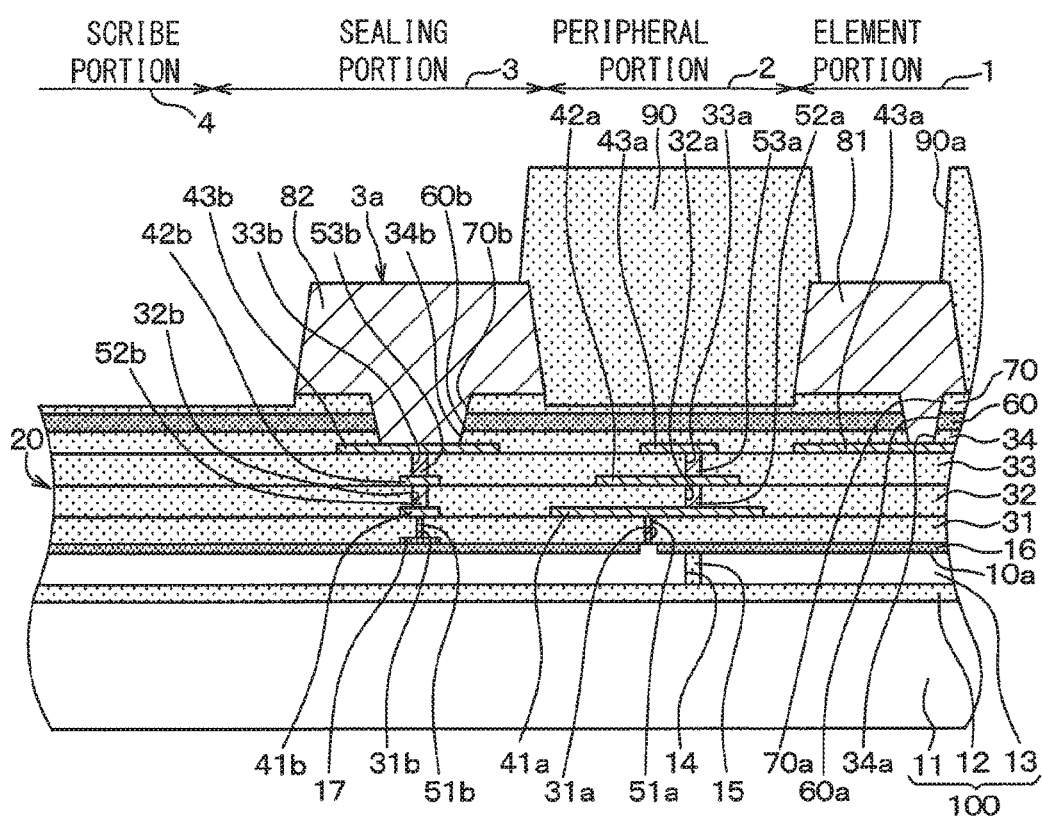
FIG. 5A is a sectional view showing the manufacturing process of the semiconductor device shown in FIG. 1.

Subsequently, as is shown in FIG. 5A, the protection film 90 made of polyimide or the like is provided so as to cover the electrode 81 and the sealing layer 82. The bonding opening 90*a* is then provided to the protection film 90 by patterning the protection film 90 by photolithography or the like so that the electrode 81 is exposed.

Figure 5B:
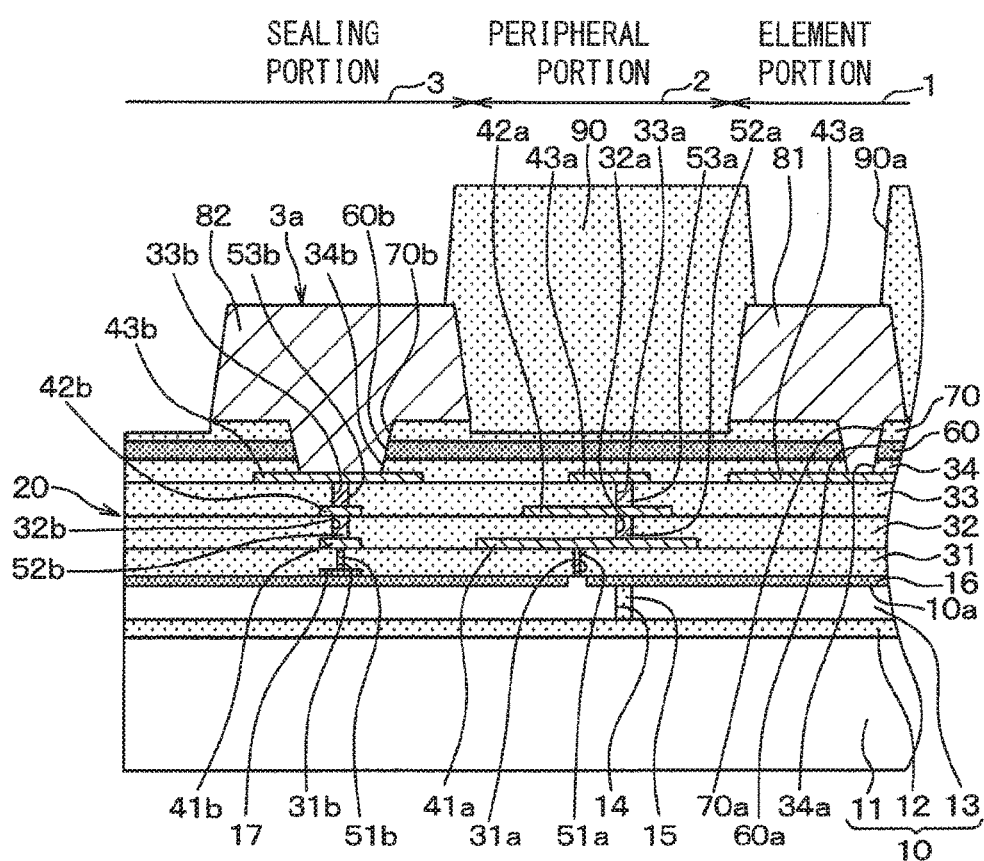
FIG. 5B is a sectional view showing the manufacturing process of the semiconductor device shown in FIG. 1.

Subsequently, as is shown in FIG. 5B, the wafer 100 is diced into individual chips by cutting the scribe portions 4 using a dicing cutter or the like. The semiconductor device shown in FIG. 1 is thus manufactured. When the scribe portions 4 are cut, as is shown in FIG. 6, cracking C may possibly occur in the sealing portion 3 adjacent to the scribe portion 4. However, the sealing structure 3*a* restricts the cracking C from extending. Hence, propagation of the cracking C to the element portion 1 can be restricted. As has been described, the first through fourth interlayer insulating films 31 through 34 and the protection insulating film 70 are made of a material having lower hardness than the nitride film 60. The cracking C is therefore readily introduced to the nitride film 60.

As has been described, in the present embodiment, the nitride film 60 is sandwiched between the protection insulating film 70 and the fourth interlayer insulating film 34 both having higher adhesion to metal (sealing layer 82 and the third sealing wiring 43*b*) than the nitride film 60. The nitride film 60 located on an outer side of the sealing structure 3*a* is partially sandwiched between the sealing layer 82 and the third sealing wiring 43*b* together with the protection insulating film 70 and the fourth interlayer insulating film 34. Hence, even when the cracking C occurs in the nitride film 60, peeling and scattering of the nitride film 60 during transportation of the semiconductor device or use of the semiconductor device can be restricted.

Further, compared with the sealing layer 82, the protection insulating film 70 has higher adhesion to the nitride film 60, and compared with the third sealing wiring 43*b*, the fourth interlayer insulating film 34 has higher adhesion to the nitride film 60. Hence, peeling of the nitride film 60 can be also restricted compared with a case where the nitride film 60 is contacted with the sealing layer 82 or with the third sealing wiring 43*b*.

The protection insulating film 70 is made of a material having lower hardness than the nitride film 60. Hence, even in a case where the cracking C occurs when the wafer 100 is diced into individual chips by cutting the scribe portions 4 using a dicing cutter or the like, the cracking C occurs more readily in the nitride film 60 sandwiched between the protection insulating film 70 and the fourth interlayer insulating film 34 than in the exposed protection insulating film 70. Consequently, scattering of a foreign substance caused by the cracking C can be restricted further.

Moreover, the nitride film 60 is covered with the protection insulating film 70 in an entire portion on the opposite side to the fourth interlayer insulating film 34. Hence, even when the cracking C occurs in the nitride film 60, peeling and scattering of the nitride film 60 can be restricted further.

In addition, the stopper film 17 is disposed and the sealing structure 3*a* and the semiconductor layer 13 are insulated from each other. Hence, fluctuation of potential across the semiconductor layer 13 can be restricted.

Furthermore, in the present embodiment, the protection insulating film 70 is made of a nitrogen-free material and the metal film 80 is patterned in such a manner that the nitride film 60 is not exposed from the protection insulating film 70 in a portion on the opposite side to the fourth interlayer insulating film 34. Consequently, an effect as follows can be achieved.

Figure 7B:
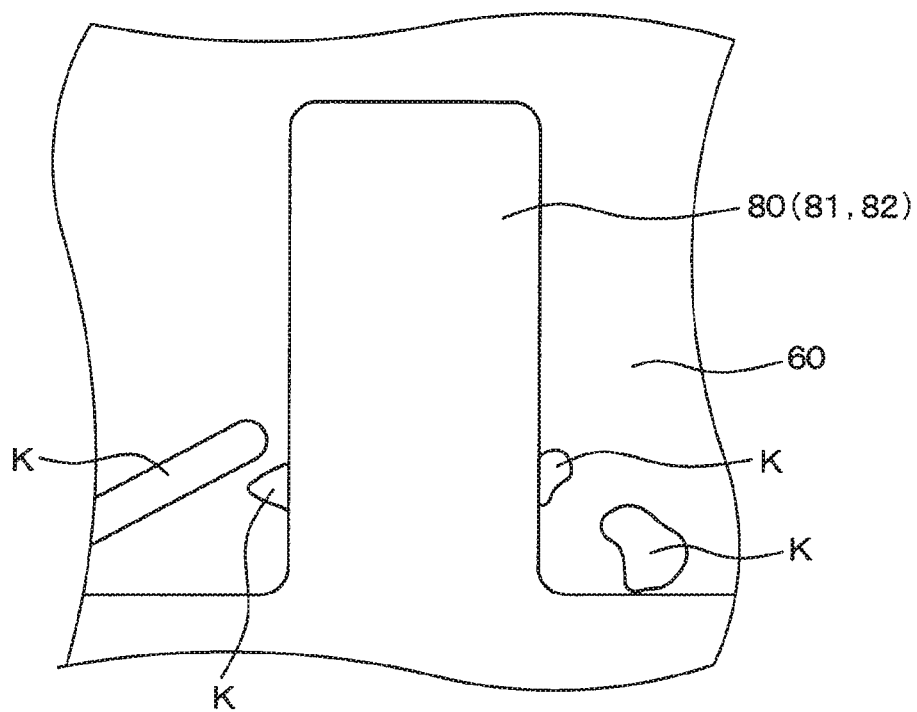
FIG. 7B is a schematic top view showing a state on a periphery of the metal film after the metal film is patterned as shown in FIG. 7A and washed.

When the metal film 80 is patterned, an etching product adheres to the electrode 81 and the sealing layer 82. In a case where the metal film 80 is patterned as is shown in FIG. 7A so as not to leave any protection insulating film 70 on the nitride film 60, that is, a part of the nitride film 60 is removed after the metal film 80 is patterned, a part of the etching product is not removed even after the metal film 80 is washed and therefore left as foreign substances K as is shown in FIG. 7B. The inventors conducted an assiduous study on such a phenomenon. Although a specific principle remains unrevealed, the inventors assumed that the foreign substances K (etching product) undergo a compositional change due to nitrogen included in the nitride film 60 and binding energy is increased too high for the foreign substances K to be removed in washing process of the metal film 80. When the metal film 80 is patterned so as not to leave any protection insulating film 70 on the nitride film 60 in the manner as above, the foreign substances K adhere to the semiconductor device and the foreign substances K may possibly become a contamination source for a manufacturing device or the like used in subsequent processes.

Figure 8A:
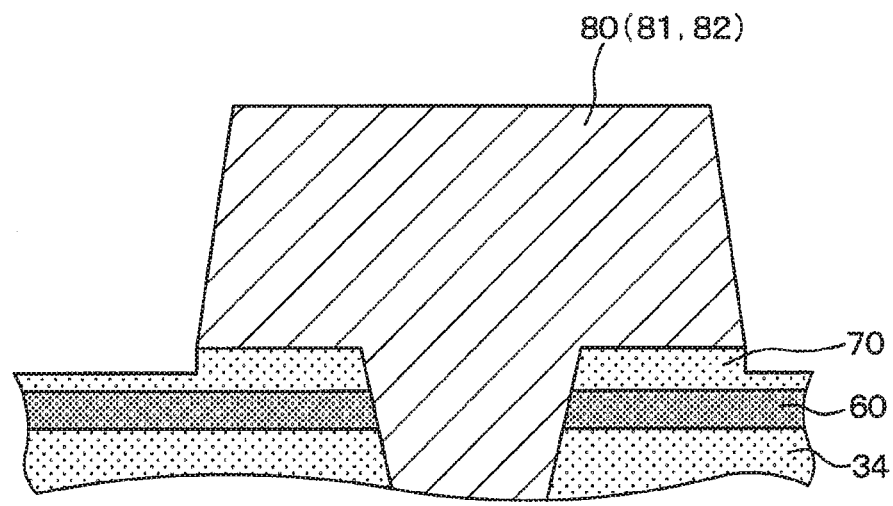
FIG. 8A is a sectional view when the metal film is patterned for the nitride film not to be exposed from the protection insulating film.
Figure 8B:
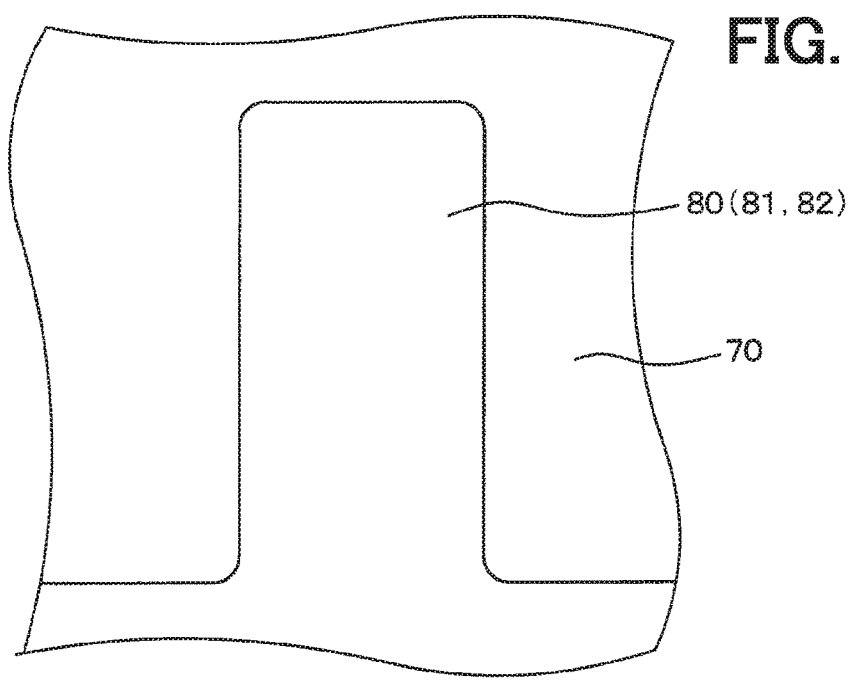
FIG. 8B is a schematic top view showing a state on a periphery of the metal film after the metal film is patterned as shown in FIG. 8A and washed.

On the contrary, when the metal film 80 is patterned as is shown in FIG. 8A so as to leave the nitrogen-free insulating film 70 on the nitride film 60, an etching product can be removed completely as is shown in FIG. 8B by washing the metal film 80. Hence, contamination of a manufacturing device used in subsequent processes can be restricted.

Second Embodiment

A second embodiment of the present disclosure will be described. In the present embodiment, a configuration of a sealing structure 3*a* is changed from the configuration in the first embodiment above. Since the remaining part is similar to the first embodiment described above, a description is not repeated herein.

Figure 9:
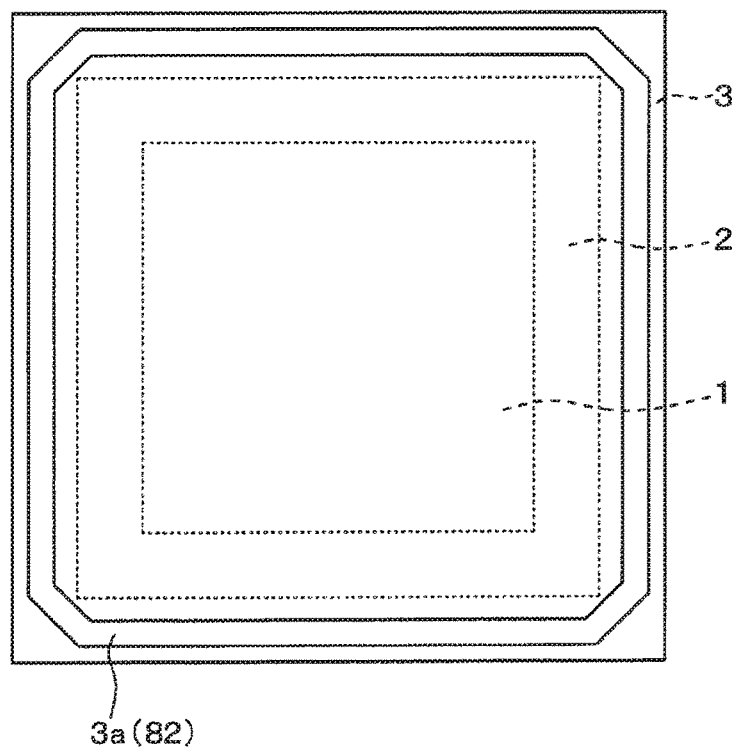
FIG. 9 is a schematic top view of a semiconductor device according to a second embodiment of the present disclosure.

In the present embodiment, as is shown in FIG. 9, when viewed in a direction normal to one surface 10*a* of a substrate 10, the sealing structure 3*a* is formed in an octagonal frame shape by chamfering corners of a rectangular frame shape. That is to say, each of a sealing layer 82, a third sealing wiring 43b, a third sealing via 53b, a second sealing wiring 42b, a second sealing via 52b, a first sealing wiring 41b, and a first sealing via 51b is formed in an octagonal frame shape.

When configured as above, an effect same as the effect of the first embodiment above can be achieved while restricting concentration of stress at a particular point in the sealing structure 3a. The present embodiment has described a case where the sealing structure 3a is formed in an octagonal frame shape. Alternatively, the sealing structure 3a may be formed in a hexagonal frame shape or a ring shape as well.

Other Embodiments

It should be understood that the present disclosure is not limited to the embodiments described above. The present disclosure can be modified as needed within the scope of the appended claims.

For example, the outer peripheral portion 2 may not be provided in the respective embodiments above. In short, the element portion 1 and the sealing portion 3 may be adjacent to each other.

Figure 10:
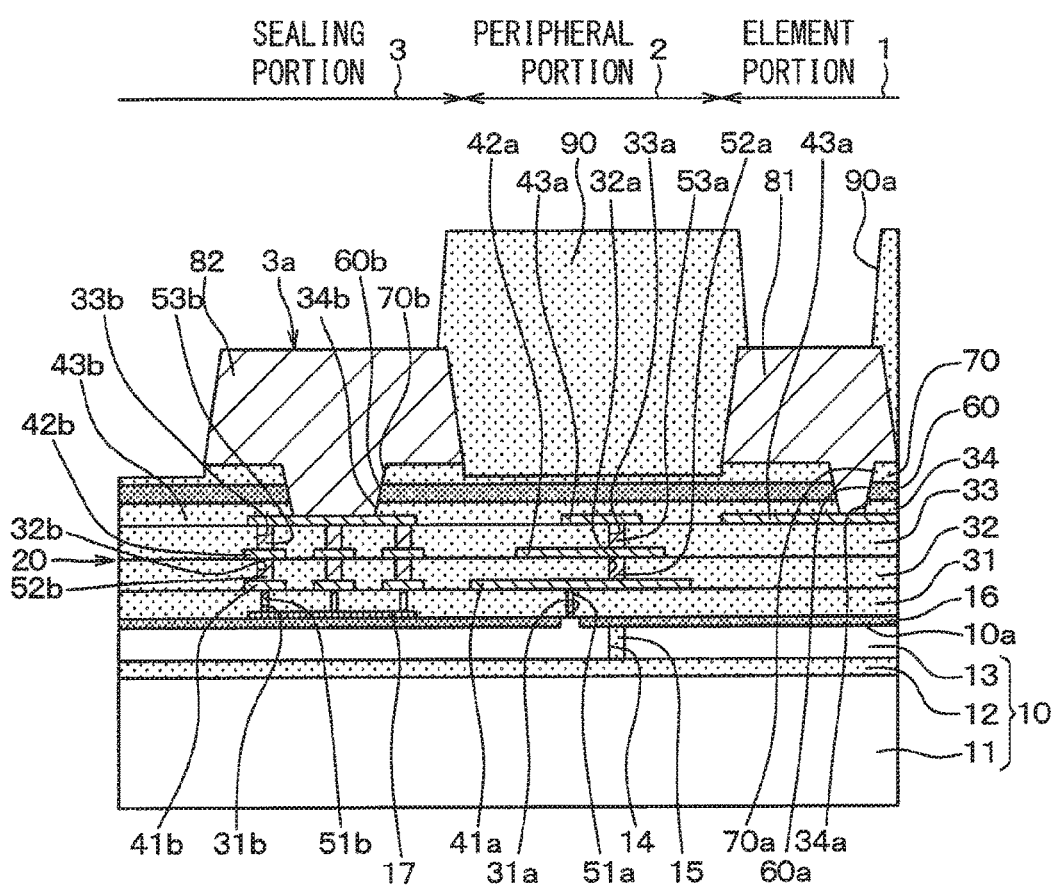
FIG. 10 is a sectional view of a semiconductor device according to another embodiment of the present disclosure.

Also, as is shown in FIG. 10, multiple first sealing wirings 41b and multiple second sealing wirings 42b may be provided and also multiple first through third sealing vias 51a through 53b may be provided in the respective embodiments above. That is to say, the first sealing wiring 41b, the second sealing wiring 42b, and the first through third sealing vias 51b through 53b may be provided so as to form a multi-frame or multi-ring structure.

Figure 11:
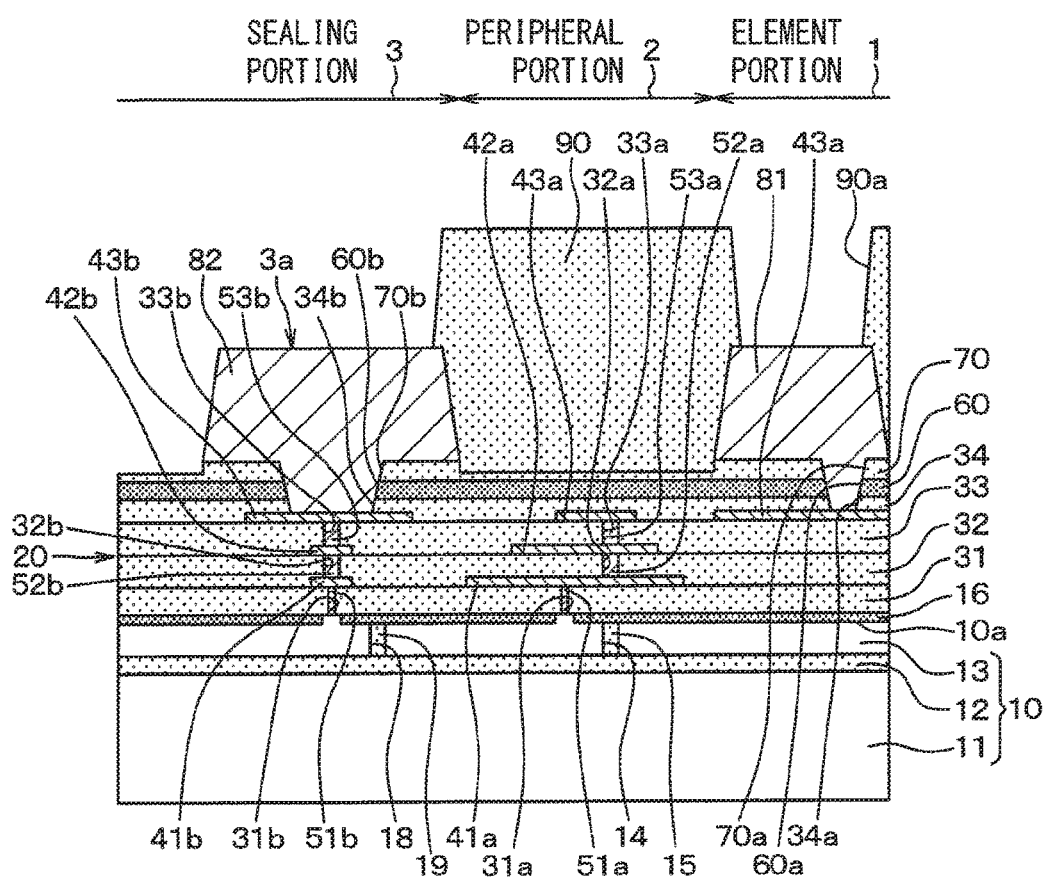
FIG. 11 is a sectional view of a semiconductor device according to another embodiment of the present disclosure.

Further, in the respective embodiments above, the separation layer 16 may be provided in such a manner as is shown in FIG. 11 that a part of the semiconductor layer 13 is also exposed in the sealing portion 3 without providing the stopper film 17 to also connect the first sealing via 51b and the semiconductor layer 13 in the sealing portion 3. In such a case, it is preferable to provide a trench 18 in the semiconductor layer 13 and embed an insulating film 19 into the trench 18 to insulate and separate the semiconductor layer 13 between a portion providing the outer peripheral portion 2 and a portion providing the sealing portion 3.

In the respective embodiments above, the substrate 10 may be a silicon substrate or the like instead of an SOI substrate.

In the respective embodiments above, the metal film 80 may be patterned by wet etching.

In the respective embodiments above, the fourth interlayer insulating film 34 may be made of a material having lower adhesion to the nitride film 60 than the third sealing wiring 43b and the protection insulating film 70 may be made of a material having lower adhesion to the nitride film 60 than the sealing layer 82. The protection insulating film 70 may be made of a material having higher hardness than the nitride film 60. The protection insulation film 70 may be made of a nitrogen-containing material.

While the disclosure has been described with reference to preferred embodiments thereof, it is to be understood that the disclosure is not limited to the preferred embodiments and constructions. The disclosure is intended to cover various modification and equivalent arrangements. In addition, while the various combinations and configurations, which are preferred, other combinations and configurations, including more, less or only a single element, are also within the spirit and scope of the disclosure.

The invention claimed is:

1. A semiconductor device comprising:
   a substrate having one surface;
   a laminated wiring layer unit disposed on the one surface of the substrate, wherein the laminated wiring layer unit includes a plurality of interlayer insulating films and a plurality of wiring layers made of metal, and the plurality of interlayer insulating films and the plurality of wiring layers are laminated alternately;
   a nitride film disposed on the laminated wiring layer unit and having a lower permeability to moisture than the interlayer insulating film;
   an element portion in which a semiconductor element is disposed; and
   a sealing portion disposed so as to surround the element portion when viewed in a direction normal to the one surface of the substrate, wherein:
   in the sealing portion, a sealing layer made of metal is disposed and the sealing layer is connected with an uppermost wiring layer located nearest to the nitride film among the plurality of wiring layers, and the sealing layer and the plurality of wiring layers connected with the sealing layer configure a sealing structure that surrounds the element portion;
   the laminated wiring layer unit includes an uppermost insulating film as an uppermost layer on a side opposite to the substrate, and the uppermost insulating film is made of a material having a higher adhesion to the uppermost wiring layer than the nitride film;
   a protection insulating film is disposed on the nitride film and the protection insulating film is made of a material having a higher adhesion to the sealing layer than the nitride film;
   in the sealing portion, a via-hole is defined in the protection insulating film, the nitride film, and the uppermost insulating film so that a part of the uppermost wiring layer is exposed, and the sealing layer is embedded into the via-hole and is also disposed on the protection insulating film at a portion located on a periphery of the via-hole; and
   the protection insulating film, the nitride film, and the uppermost insulating film are partially sandwiched between the sealing layer and the uppermost wiring layer on an outer side of the sealing structure.

2. The semiconductor device according to claim 1, wherein:
   the uppermost insulating film is made of a material having a higher adhesion to the nitride film than the uppermost wiring layer; and
   the protection insulating film is made of a material having a higher adhesion to the nitride film than the sealing layer.

3. The semiconductor device according to claim 1, wherein
   the protection insulating film is made of a material having a lower hardness than the nitride film.

4. The semiconductor device according to claim 1, wherein
   the protection insulating film covers an entire surface of the nitride film on a side opposite to the laminated wiring layer unit.

5. The semiconductor device according to claim 1, wherein
   the protection insulating film is free of nitrogen.

6. The semiconductor device according to claim 5, wherein
   the protection insulating film is an oxide film.

7. The semiconductor device according to claim 1, wherein
   the sealing structure is insulated from the substrate.

8. The semiconductor device according to claim 1, wherein
the sealing structure has a rectangular frame shape with chamfered corners when viewed in the direction normal to the one surface of the substrate.

9. The semiconductor device according to claim 1, wherein
the substrate includes a supporting substrate, an insulating film, and a semiconductor layer which are sequentially laminated.

10. A manufacturing method of the semiconductor device according to claim 1, comprising:
preparing a wafer including a plurality of chip regions each having the element portion and the sealing portion, the plurality of chip regions being defined by respective scribe portions and each of the plurality of chip regions providing the substrate when the plurality of chip regions are divided along the respective scribe portions;
disposing the laminated wiring layer unit on the one surface of the wafer;
disposing the nitride film on the laminated wiring layer unit;
disposing the protection insulating film on the nitride film;
disposing the via-hole in the sealing portion to penetrate the protection insulating film, the nitride film, and the uppermost insulating film so that a part of the uppermost wiring layer is exposed;
depositing a metal film on the protection insulating film while filling up the via-hole;
forming the sealing layer by patterning the metal film;
forming the sealing structure including the plurality of wiring layers and the sealing layer in such a manner that the protection insulating film, the nitride film, and the uppermost insulating film are partially sandwiched between the sealing layer and the uppermost wiring layer on an outer side of the sealing structure; and
dicing the wafer into individual chips along the respective scribe portions.

11. The manufacturing method of the semiconductor device according to claim 10, wherein:
in the disposing of the protection insulating film, a protection insulating film which is free of nitrogen is used as the protection insulating film;
in the disposing of the protection insulating film, the protection insulating film is disposed such that an entire surface of the nitride film is covered by the protection insulating film on a side opposite to the laminated wiring layer unit; and
in the forming of the sealing layer, a dry etching is carried out to the metal film for patterning the metal film.

* * * * *